US006202916B1

(12) United States Patent
Updike et al.

(10) Patent No.: US 6,202,916 B1

(45) Date of Patent: Mar. 20, 2001

(54) METHOD OF WAVE SOLDERING THIN LAMINATE CIRCUIT BOARDS

(75) Inventors: Theresa Ann Updike, Carmel; Richard Scott King; Michael Thomas Coles, both of Kokomo, all of IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/327,742

(22) Filed: Jun. 8, 1999

(51) Int. Cl.[7] .................................................... B23K 31/02

(52) U.S. Cl. .................................... 228/180.1; 228/123.1; 228/212; 228/214; 228/222

(58) Field of Search ................................ 228/4.5, 123.1, 228/178, 212, 214, 47.1, 180.21, 180.22, 222, 46; 29/180.1; 438/26, 51, 55, 64, 106

(56) References Cited

U.S. PATENT DOCUMENTS 4,610,391 * 9/1986 Nowotarski .......................... 228/219
4,801,065 * 1/1989 Colquitt et al. ........................ 228/19
5,617,990 * 4/1997 Thompson, Sr. .................. 228/180.1
5,674,785 * 10/1997 Akram et al. ........................ 437/217
5,704,535 * 1/1998 Thompson, Sr. ....................... 228/39
5,950,304 * 9/1999 Khandros et al. ..................... 29/831
5,965,944 * 10/1999 Frankoski et al. ................... 257/779
6,045,032 * 4/2000 Longgood et al. .

* cited by examiner

*Primary Examiner*—Clifford C. Shaw
*Assistant Examiner*—Colleen P. Cooke
(74) *Attorney, Agent, or Firm*—Jimmy L. Funke

(57) ABSTRACT

A method and assembly for preserving solder connections of components mounted on a thin laminate circuit board during wave soldering of leaded components to the circuit board. The method generally entails supporting the circuit board on a pallet with pedestals that contact the surface of the circuit board directly opposite surface-mount components on the board. The pallet also includes an access directly opposite leaded components assembled to the board so that their leads are exposed. The pallet and board assembly are then placed on a wave soldering apparatus and wave soldered while applying and maintaining a force to the circuit board that ensures contact between the pedestals and the surface of the board opposite the surface-mount components, so that the leads of the leaded components are soldered to the circuit board.

10 Claims, 1 Drawing Sheet

METHOD OF WAVE SOLDERING THIN LAMINATE CIRCUIT BOARDS

TECHNICAL FIELD

The present invention generally relates to circuit board construction and processes. More particularly, this invention relates to a technique for preserving solder connections of circuit components mounted to a thin laminate circuit board, and particularly surface-mount components soldered to such a board, during wave soldering of leaded through-hole components to the board.

BACKGROUND OF THE INVENTION

Wave soldering is a well-known method by which solder connections are formed on a printed circuit board (PCB) by bringing the circuit board in contact with a wave of molten solder flowing upward from a nozzle. Wave soldering methods typically apply a relatively thin coating of solder, and therefore find widest use for applications in which a solderable contact or metal lead is to be coated with solder to form a solder fillet or solder connection, respectively. One such example is a circuit component having leads that extend through a circuit board, and to which solder is applied to physically and electrically connect the component to the board. During wave soldering, the circuit board, supported at its perimeter with a pallet, passes through molten solder coming up from the nozzle, such that the ends of the leads projecting through the circuit board are brought in contact with the upward-flowing molten solder. In the process of adhering to the leads, the solder forms solder connections or fillets.

While leaded circuit devices are widely employed in electronic applications, and wave soldering is widely practiced to attach and electrically connect such devices to printed circuit boards, a continuous effort to reduce the size of circuit board assemblies has promoted the use of such advanced packaging technologies as tape automated bonding (TAB), chip on board (COB), flip chips, multichip modules (MCM) and ball grid arrays (BGA). These devices are generally surface-mount technology (SMT) components attached to a circuit board with solder, such as solder bumps that are formed on the devices and then reflowed to solder the devices to appropriate conductor patterns on the board.

While highly successful, SMT devices are vulnerable to downstream processes that can damage their solder connections. As an example, because of their rigidity, flip chips are vulnerable to mechanical loads that distort the circuit board, causing fracturing or separation of their solder bump connections. Wave soldering is a notable example of such downstream processing, during which thermally-induced board distortion occurs as a result of molten solder contacting only one surface of the board. If not minimized, this distortion may cause significant quality concerns, including fracturing and/or separation of solder connections, potential destruction of the affected device(s), and reduced overall system reliability. In the past, PCBs have been of sufficient thickness to allow wave soldering without unacceptable levels of board distortion. Preheating PCBs to achieve a more uniform temperature throughout the board has been used to further reduce board distortion, to the extent that an adequate board flatness of about 0.020 to 0.030 inch (about 0.50 to 0.75 mm) has typically been maintained. However, thin laminate PCBs (e.g., thicknesses of 0.032 inch (about 0.8 mm) and less) are more prone to distortion during wave soldering, with the result that fracturing and separation of flip chip solder connections is much more likely to occur. While the incidence of solder connection fracturing and separation can be reduced or avoided by the use of alternative circuit devices and soldering processes, such solutions are often not practical or cost effective.

Therefore, what is needed is a method for reducing the incidence of solder connection fracturing and separation of SMT devices during a wave soldering operation.

SUMMARY OF THE INVENTION

The present invention provides a method and assembly for preserving solder connections of components mounted on a circuit board during wave soldering of leaded components to the circuit board. In such a circuit board assembly, surface-mount components may be present on either surface of the board, while leaded components are located on one surface of the board with their leads extending through through-holes in the board to the opposite surface of the board. The method of this invention generally entails supporting the circuit board on a pallet such that the surface of the circuit board with the exposed leads contacts the pallet. The pallet is configured in accordance with the invention to include raised pedestals that contact surface regions of the circuit board directly opposite to one or more surface-mount components whose solder connections are at risk of damage during wave soldering. The pallet also includes accesses directly opposite the leaded components so that their leads remain exposed. The pallet and board assembly are then placed on a wave soldering apparatus and, while applying and maintaining a force to the board that ensures contact with the pedestals, the circuit board is wave soldered through the accesses in the pallet so that the leads of the leaded components are soldered to the circuit board. Importantly, the circuit board is held firmly against the pallet by the force in such a manner that maintains board flatness throughout soldering, so that the solder connections attaching the surface-mount components to the circuit board do not fracture or separate. As an example, a suitable flatness (i.e., edge-to-edge deflection) for a 4×4 inch (about 100×100 mm) circuit board has been determined to be not more than 0.010 inch (about 0.25 mm), and preferably about 0.003 inch (about 0.08 mm).

According to the above, the pallet of this invention has enabled wave soldering of thin laminate circuit boards while maintaining a board flatness that is far better than that practiced or achievable with conventional wave soldering practices. Without such flatness control, thin laminate circuit boards having surface-mount devices such as flip chips are unable to undergo wave soldering without adversely affecting the reliability of the devices as a result of damage to their solder connections.

Other objects and advantages of this invention will be better appreciated from the following detailed description.

DESCRIPTION OF THE PREFERRED EMBODIMENT

Figure 1:
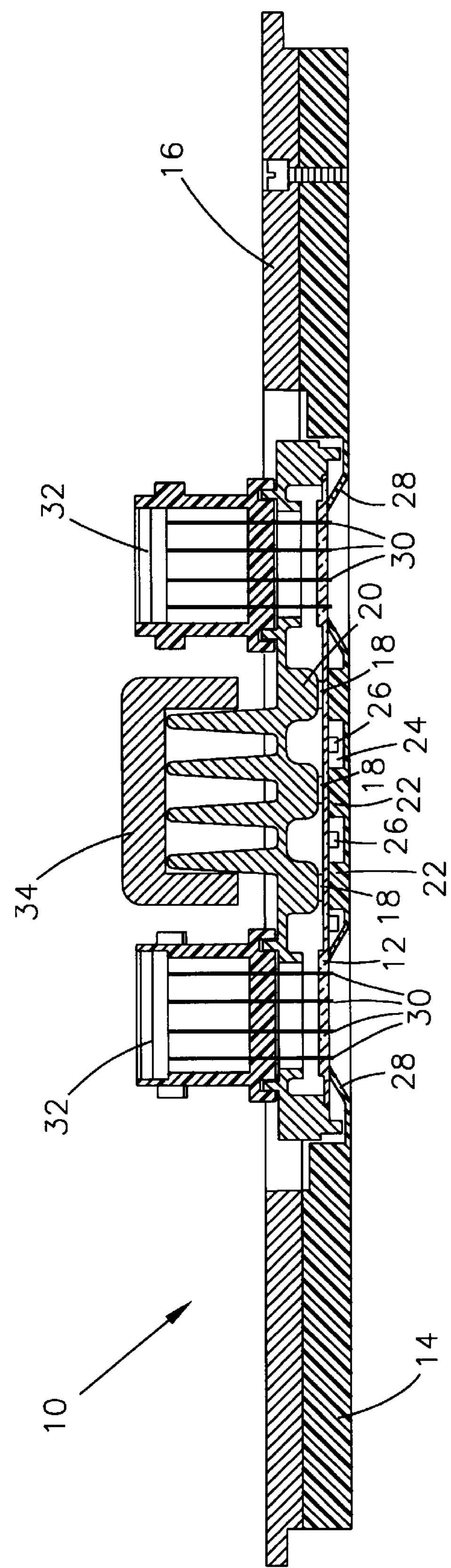
FIG. 1 is a cross-sectional view of a circuit board and pallet assembly in accordance with a preferred embodiment of this invention.

Illustrated in FIG. 1 is an assembly 10 composed of a circuit board 12 supported by a pallet 14 in preparation for undergoing wave soldering in accordance with this invention. The pallet 14 is preferably formed of a relatively rigid material, such as a glass-filled organic material, that can withstand temperatures encountered during wave soldering while providing a rigid base with which the board 12 is firmly supported. The rigidity of the pallet 14 can be promoted by attaching ribs or rails (not shown) in one or both surfaces of the pallet 14. A carrier plate 16 is shown attached to the pallet 14, and provides additional stiffness and rigidity to promote board flatness, provides a solid base for the attachment of clamps or other fixtures, and improves the durability of the pallet 14. As shown, the circuit board 12 is ready for wave soldering using known and commercially available wave soldering equipment.

The circuit board 12 is illustrated in the FIG. 1 as a thin laminate PCB, such as a glass-reinforced or woven fiberglass-reinforced epoxy resin laminate known as FR4. The thickness of the board 12 may be on the order of about 0.032 inch (about 0.8 mm) or less to minimize package size and weight. A number of flip chips 18 are shown as being mounted on the upper surface of the board 12, though other surface-mount technology (SMT) components could be present. A finned header or heat sink 20 is shown mounted to the upper surface of the board 12, and contacts the chips 18 for the purpose of dissipating heat from the chips 18.

Contrary to conventional practice, the board 12 is supported by the pallet 14 not only at the board perimeter, but also from beneath, including several raised pedestals 22 that contact the lower surface of the circuit board 12 directly opposite the chips 18. The pallet 14 is also configured to have several recesses 24 that receive or accommodate circuit components 26 that may be attached by reflow soldering or other suitable methods to the lower surface of the board 12. As a result, these components 26 are shielded by the pallet 14 during wave soldering. Also formed in the pallet 14 are openings 28 that expose pins 30 shown as being associated with a pair of connectors 32 mounted to the circuit board 12. As shown, the openings 28 have chamfers of up to about 45 degree, preferably about 30 degree chamfer, to promote solder access to the pins 30 during wave soldering. The connectors 32 are shown as being part of a header assembly that is secured to the board 12 by soldering the pins 30 within through-holes in the circuit board 12 using a wave soldering operation, which can be performed in accordance with known wave soldering techniques and equipment.

Based on the above, the pedestals 22 serve to support the circuit board 12 in the critical region of the flip chips 18 and their solder bump connections (not shown), so that the board 12 is less prone to being distorted during wave soldering of the pins 28 to the board 12. With reduced board distortion, the connections are less likely to fracture or separate during wave soldering and subsequent final assembly steps. To further immobilize the board 12, the assembly 10 further includes a loading device 34 adapted to apply a force to the circuit board 12 at a location inward from the perimeter of the board 12 (e.g., opposite the pedestals 22 as shown in FIG. 1), so that the board 12 is essentially held against the pedestals 22. The loading device 34 may be a simple weight, a specially adapted clamp, or any other suitable device capable of generating a controlled load and applying the load to the circuit board 12. As shown, the force generated by the loading device 34 is transmitted to the board 12 through the heat sink 20, though it is foreseeable that the force could be applied directly to the circuit board 12. While the optimum load for any given board 12 will vary depending on its size and thickness, loads in the range of about one to about 5 pounds (about 4.5 to about 22.2 Newtons) are believed to be suitable.

The pedestals 22 may be integrally formed with the pallet 14, and therefore formed of a relatively rigid material such as a glass-filled organic compound. Alternatively, the pedestals 22 may be formed of a compliant polymer or other suitably resilient material, and attached to the pallet 14 so that they distribute and absorb any distortion that might otherwise be induced in the board 12 due to the manner in which the board 12 is loaded by the device 34. With pedestals 22 of either material, edge-to-edge deflection of a 4×4 inch laminate PCB having a thickness of about 0.32 inch (about 0.8 millimeter) can be maintained on the order of about 0.003 inch (about 0.08 mm) or less, which is far better than the 0.020 to 0.030 inch (0.5 to 0.8 millimeter) flatness typically achieved with prior art wave soldering pallets.

During an investigation leading to this invention, testing was conducted to determine the necessary process parameters for wave soldering thin laminate PCBs. Tests involved subjecting fiberglass circuit boards with flip chips to wave soldering runs in which solder temperature, circuit board preheat temperatures, and loading conditions were varied. Molten 67Sn/37Pb eutectic solder was applied at temperatures in the range of about 430 to 480° F. (about 220 to 250° C.), while preheat temperatures were between about 168 to 186° F. (about 75 to 85° C.). Some of the pallets were configured in accordance with this invention to have cylindrical pedestals formed of either silicone rubber or epoxy, which were positioned on the pallets to contact the surface of the boards opposite the chips as shown in FIG. 1. Loads of between about one and about five pounds (about 4.5 and about 22.2 Newtons) were applied to some of the test units. The results were that board distortion following wave soldering was reduced to as little as 0.001 inch (about 0.025 mm) when combinations of pedestals and clamping loads were used. Without the combination of pedestals and clamping loads of this invention, edge-to-edge deflections of at least about 0.010 inch (about 0.25 mm) and as large as about 0.040 inch (about 1.0 mm) occurred, which caused or would promote fracturing and separation of the flip chip solder connections to the boards.

Further testing directed toward determining the effect of preheat temperature on hole filling and solder joint consistency was then performed. Because pallets in accordance with this invention shield heat-sensitive areas (e.g., flip chip sites) of a circuit board assembly, it was speculated that, contrary to conventional practice, topside preheating could be reduced or completely eliminated, and that higher bottom-side preheat temperatures could be employed to promote flux activation throughout each solder joint and also promote the capillary effect of the molten solder. Based on this investigation, circuit boards processed in accordance with this invention can forego any preheating of their topside, while bottom-side preheat temperatures of as high as about 200° F. (about 94° C.) may be safely employed.

While our invention has been described in terms of a preferred embodiment, it is apparent that other forms could be adopted by one skilled in the art. Accordingly, the scope of our invention is to be limited only by the following claims.

What is claimed is:

1. A method of preserving solder connections of components mounted on a circuit board during wave soldering, the method comprising the steps of:

providing a circuit board having a first component attached with solder to a first surface of the circuit board and a second component disposed on the first surface and having leads extending through through-holes in the circuit board to an oppositely-disposed second surface of the circuit board;

supporting the circuit board on a pallet, the pallet having a pedestal that contacts the second surface of the circuit board opposite the first component and an access directly opposite the second component so that the leads of the second component are exposed; and placing the pallet on a wave soldering apparatus and then, while applying and maintaining a force to the circuit board that maintains contact between the pedestal and the second surface of the circuit board opposite the first component and that limits edge-to-edge deflection within the circuit board, wave soldering the second surface of the circuit board through the access in the pallet so that the leads of the second component are soldered to the circuit board and so that the solder attaching the first component to the first surface of the circuit board does not fracture or separate.

2. The method set forth in claim 1, wherein the first component is a flip chip that is attached to the first surface of the circuit board with solder bump connections.

3. The method set forth in claim 1, wherein the pedestal is formed of a compliant material.

4. The method set forth in claim 1, wherein the pedestal is an integrally-formed extension of the pallet.

5. The method set forth in claim 4, wherein the pallet and the pedestal are formed of a rigid material.

6. The method set forth in claim 1, wherein the pallet supports the circuit board at a perimeter thereof, the pedestal contacts the second surface of the circuit board at a location inwardly from the perimeter, and the force is applied to the first component at a location inward from the perimeter of the circuit board.

7. The method set forth in claim 1, wherein the circuit board has a thickness of not more than 0.08 mm, and exhibits an edge-to-edge deflection of not more than 0.25 mm during the wave soldering step.

8. The method set forth in claim 1 wherein, prior to wave soldering, the first surface of the circuit board is not preheated and the second surface of the circuit board is preheated to a temperature of up to 200° F.

9. The method set forth in claim 1, wherein the circuit board has a third component attached to the second surface of the circuit board, and the pallet has a cavity in which the third component is received when the circuit board is supported on the pallet during wave soldering.

10. A method of preserving solder connections of components mounted on a circuit board during wave soldering, the method comprising the steps of:

providing a printed circuit board having a thickness of not more than 0.08 mm, a first flip chip attached with solder bump connections to a first surface of the circuit board, a reflow-soldered component attached to the circuit board, and a leaded component disposed on the first surface and having leads extending through through-holes in the circuit board to an oppositely-disposed second surface of the circuit board;

placing the circuit board on a pallet such that the second surface of the circuit board contacts the pallet, the pallet supporting the circuit board at a perimeter thereof and having a raised pedestal that contacts the second surface of the circuit board at a location opposite the flip chip and inwardly from the perimeter, the pallet having an access directly opposite the leaded component so that the leads of the leaded component are exposed, the pallet having a cavity in which the reflow-soldered component is received;

applying a force to the circuit board at a location on the first surface opposite the pedestal so as to ensure contact between the pedestal and the second surface of the circuit board opposite the flip chip and to limit edge-to-edge deflection within the circuit board to not more than 0.25 mm; and placing the pallet on a wave soldering apparatus and then, after preheating the second surface of the circuit board to a temperature of up to 200° F. and without preheating the first surface of the circuit board, and while maintaining the force applied to the circuit board, wave soldering the second surface of the circuit board through the access in the pallet so that the leads of the leaded component are soldered to the circuit board and the solder connections of the flip chip do not fracture or separate.

* * * * *